(12) United States Patent
Huang et al.

(10) Patent No.: US 12,342,507 B2
(45) Date of Patent: Jun. 24, 2025

(54) SEPARATED HEAT DISSIPATING DEVICE HAVING SUSPENSION MECHANISM AND OPTICAL MODULE SYSTEM THEREOF

(71) Applicant: Alpha Networks Inc., Hsinchu (TW)

(72) Inventors: Hao Huang, Hsinchu (TW); Guan-Fu Lin, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 256 days.

(21) Appl. No.: 18/142,020

(22) Filed: May 1, 2023

(65) Prior Publication Data
US 2024/0206124 A1  Jun. 20, 2024

(30) Foreign Application Priority Data

Dec. 20, 2022 (TW) .................................. 111149023

(51) Int. Cl.
*H05K 7/20* (2006.01)
*G02B 6/42* (2006.01)

(52) U.S. Cl.
CPC ......... *H05K 7/2049* (2013.01); *G02B 6/4269* (2013.01)

(58) Field of Classification Search
CPC .................................................. H01L 23/4006
See application file for complete search history.

(56) References Cited

U.S. PATENT DOCUMENTS

| | | | | |
|---|---|---|---|---|
| 6,980,437 B2 * | 12/2005 | Bright | ................... | H04B 1/036 361/704 |
| 7,539,020 B2 * | 5/2009 | Chow | ................ | H05K 7/20781 361/759 |
| 8,289,710 B2 * | 10/2012 | Spearing | ............. | H05K 7/20727 361/699 |
| 8,449,331 B2 * | 5/2013 | Phillips | .............. | H01R 13/6581 439/607.21 |
| 8,879,262 B2 | 11/2014 | Shi | | |
| 10,091,911 B2 * | 10/2018 | Kelty | ................... | G02B 6/4269 |
| 11,303,059 B2 * | 4/2022 | Duan | ................. | H05K 7/20418 |
| 11,855,371 B2 * | 12/2023 | He | ..................... | H05K 7/20418 |
| 12,160,979 B2 * | 12/2024 | Liu | ...................... | H05K 7/2049 |

FOREIGN PATENT DOCUMENTS

| | | |
|---|---|---|
| CN | 215867233 | 2/2022 |
| CN | 216670333 | 6/2022 |
| TW | I373299 B | 9/2012 |
| TW | 201937818 A | 9/2019 |
| TW | 202203738 A | 1/2022 |

* cited by examiner

Primary Examiner — Robert J Hoffberg
(74) Attorney, Agent, or Firm — CIPO IP Group

(57) ABSTRACT

A separated heat dissipating device, and an optical module system thereof, includes at least one heat dissipating module and at least one suspension mechanism. The heat dissipating module has a lateral surface that can abut against an electronic device's surface, and another lateral surface disposed with at least one first mounting member and mountable with the suspension mechanism. The suspension mechanism includes at least one elastic element that can be sleeved around the first mounting member, a fixing plate formed with at least one through hole allowing passage of the first mounting member and the elastic element to be located between the heat dissipating module and the fixing plate, and at least one second mounting member that can be assembled with the first mounting member. The heat dissipating module moves towards the fixing plate and compresses the elastic element when a surface thereof is applied with a force.

17 Claims, 8 Drawing Sheets

SEPARATED HEAT DISSIPATING DEVICE HAVING SUSPENSION MECHANISM AND OPTICAL MODULE SYSTEM THEREOF

CROSS-REFERENCE TO RELATED PATENT APPLICATION

This non-provisional application claims priority to and the benefit of, under 35 U.S.C. § 119(a), Taiwan Patent Application No. 111149023, filed Dec. 20, 2022 in Taiwan. The entire content of the above identified application is incorporated herein by reference.

FIELD

The present disclosure relates to a heat dissipating device, and more particularly to a separated heat dissipating device having a suspension mechanism and an optical module system thereof.

BACKGROUND

High-speed transceivers for use with fiber-optic cables (also known as optical modules, one notable example of which is QSFP-DD (Quad Small Form-factor Pluggable-Double Density) transceivers) were developed as a pluggable solution to high-speed transmission to and from big-data cloud-based data centers. QSFP-DD is the current mainstream packaging specifications for 400G optical modules and provides convergence data rates as high as 400 Gb/s, which helps increase data capacities to the greatest extent. However, heat dissipation from QSFP-DD transceivers has been an issue and has posed a huge challenge to the control of the ambient temperature of a QSFP-DD transceiver and to the transmission performance of such a transceiver. Currently, according to calculations based on the operations of high-performance data centers, the typical 400G FR transmission distance is 2 km, and the associated power consumption is 14 W. In the future, the ZR transmission distance of even higher-speed transmission will be 80 km, and the associated power consumption will be increased to 25 W. To satisfy the need for reliable 400G or 800G data transmission, therefore, an improvement in heat dissipation efficiency is required.

Referring to FIG. 1, a conventional optical module A is used in conjunction mainly with a conventional heat sink B developed by a module manufacturer. The conventional heat sink B, however, works only when ambient temperature, or the temperature of the system where the conventional heat sink B is used, is not higher than 50° C. According to the temperature distribution shown in FIG. 1, the first temperature T1 is 77.5° C., the second temperature T2 is 82° C., the third temperature T3 is 87.7° C., the fourth temperature T4 is 70° C., the fifth temperature T5 is 76.7° C., and the sixth temperature T6 is 84.5° C. The direction of the arrow in FIG. 1 is meant to roughly present the temperature gradience tendency from low to high across the conventional optical module A and conventional heat sink B, as shown in shades in FIG. 1. It can be known from the above that the conventional heat sink B does not spread heat evenly during heat dissipation, and therefore is less effective in heat dissipation, causing a part of it to easily accumulate heat (the greatest temperature difference across the heat sink B can be 14.5° C.). Further, the elastic metal plates used to secure the heat sink B do not provide sufficient structural strength, and the securing force is not evenly applied to the contact surfaces, or the thermal conduction surfaces, between the heat sink B and the optical module A. In addition, the heat sink B is customized and modularized according to the optical module A, and therefore can suffer from the issue of lower compatibility among different products, which results in the high price of a conventional heat sink B.

Accordingly, one of the issues addressed in the present disclosure is to satisfy the needs driven by performance competition, and to improve on the inadequacies of the conventional heat sinks.

SUMMARY

To meet the operational demands at high environment temperature (e.g., a system operating temperature is higher than 55° C.), and to provide a progressive design answering to the higher-speed transmission (ZR) and higher power consumption (25 W) in the future, as a result of repeated research and test, the present disclosure provides a separated heat dissipating device having a suspension mechanism, and an optical module system thereof, to satisfy the needs in the industry, and to effectively solve the above-referenced issues.

Certain aspects of the present disclosure are directed to a separated heat dissipating device including at least one heat dissipating module and at least one suspension mechanism. The heat dissipating module has a first lateral surface that can abut against a surface of an electronic device, and a second lateral surface disposed with at least one first mounting member. The suspension mechanism can be mounted on the second lateral surface of the heat dissipating module, and includes at least one elastic element, a fixing plate and at least one second mounting member. The elastic element can be sleeved around the first mounting member of the heat dissipating module. The fixing plate is formed with at least one through hole that allows passage of the first mounting member and allows the elastic element to be located between the heat dissipating module and the fixing plate. The second mounting member can be assembled with the first mounting member. The heat dissipating module moves towards the fixing plate and compresses the elastic element when a surface of the heat dissipating module is applied with a force.

In certain embodiments, the separated heat dissipating device has two heat dissipating modules, and the fixing plate of the suspension mechanism can span across the two heat dissipating modules, and be fixed to first mounting members of the two heat dissipating modules through second mounting members of the suspension mechanism.

In certain embodiments, the heat dissipating module includes a first heat dissipating portion, a second heat dissipating portion and a base, the first heat dissipating portion includes a plurality of first fins, the second heat dissipating portion includes a plurality of second fins, and the base is made of a metal material and can be sandwiched between the first heat dissipating portion and the second heat dissipating portion.

In certain embodiments, the first fins are arranged in fin units, each two adjacent ones of the fin units are separated from each other by an interval, and the interval is disposed with the suspension mechanism.

In certain embodiments, the separated heat dissipating device can be locked to a shell having at least one prop, and the fixing plate is configured to be fixed to the prop.

In certain embodiments, the separated heat dissipating device can be locked to a circuit board having at least one prop, and the fixing plate can be fixed to the prop.

In certain embodiments, the base is formed with a receiving space for receiving at least one of at least one heat pipe and at least one vapor chamber.

In certain embodiments, an inner surface of the first mounting member has a first thread portion, an outer surface of the second mounting member has a second thread portion corresponding to, and threadedly connectable with, the first thread portion, and the second mounting member can be inserted into and assembled with the first mounting member through the first thread portion and the second thread portion.

In certain embodiments, a lateral surface of the base that can lie against the electronic device has a protruding portion to increase a contact area between the base and the electronic device.

Certain aspects of the present disclosure are directed to an optical module system including an optical module device that can be mounted on a circuit board, and a separated heat dissipating device that can be assembled with the optical module device. The separated heat dissipating device includes at least one heat dissipating module and at least one suspension mechanism. The heat dissipating module has a first lateral surface that can abut against a surface of an electronic device, and a second lateral surface disposed with at least one first mounting member. The suspension mechanism can be mounted on the second lateral surface of the heat dissipating module, and includes at least one elastic element, a fixing plate and at least one second mounting member. The elastic element can be sleeved around the first mounting member of the heat dissipating module. The fixing plate is formed with at least one through hole that allows passage of the first mounting member and allows the elastic element to be located between the heat dissipating module and the fixing plate. The second mounting member can be assembled with the first mounting member. The heat dissipating module moves towards the fixing plate and compresses the elastic element when a surface of the heat dissipating module is applied with a force.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION

Figure 1:
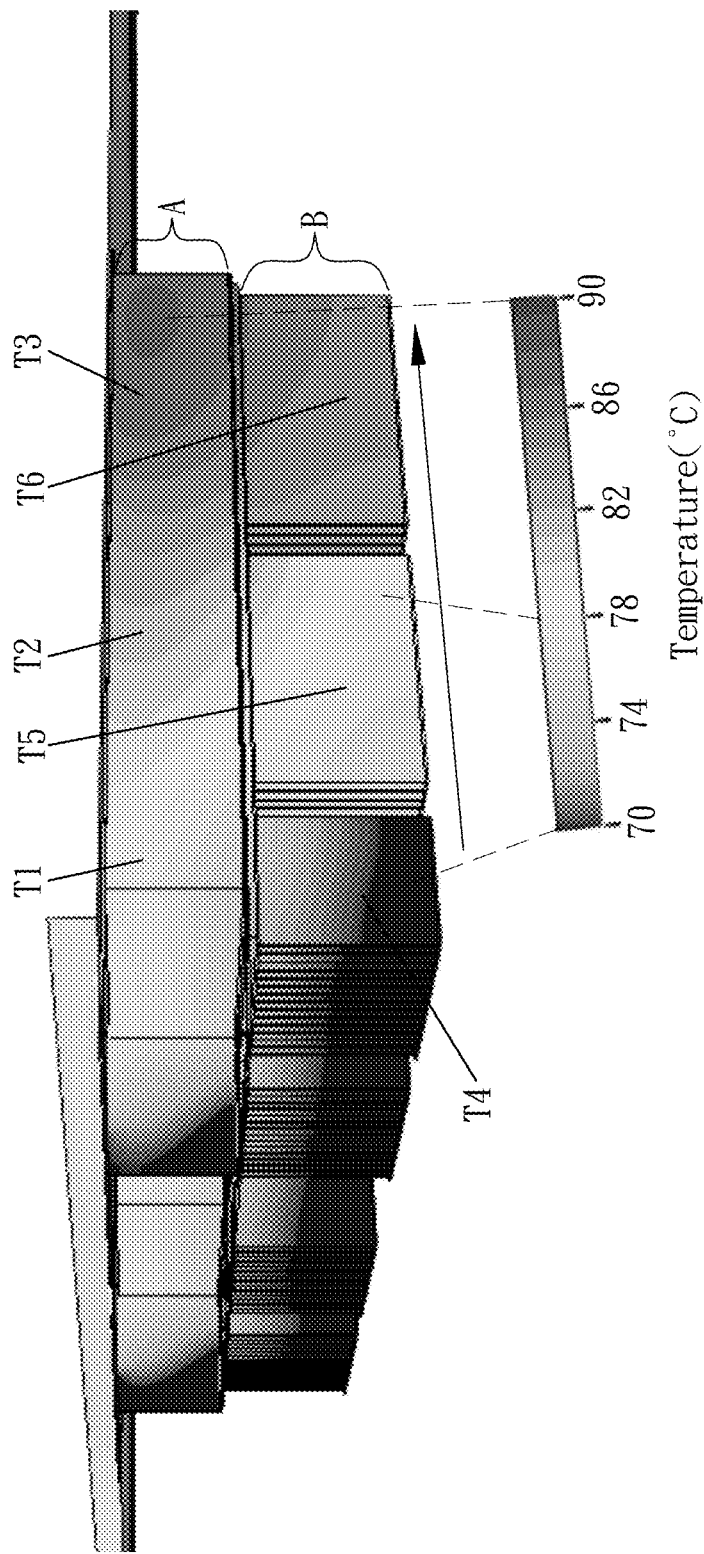
FIG. 1 is a temperature distribution diagram of a conventional optical module and heat sink.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The accompanying drawings are schematic and may not have been drawn to scale. The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, materials, objects, or the like, which are for distinguishing one component/material/object from another one only, and are not intended to, nor should be construed to impose any substantive limitations on the components, materials, objects, or the like. Directional terms (e.g., "front", "rear", "left", "right", "upper/top" and/or "lower/bottom") are explanatory only and are not intended to be restrictive of the scope of the present disclosure.

Figure 2A:
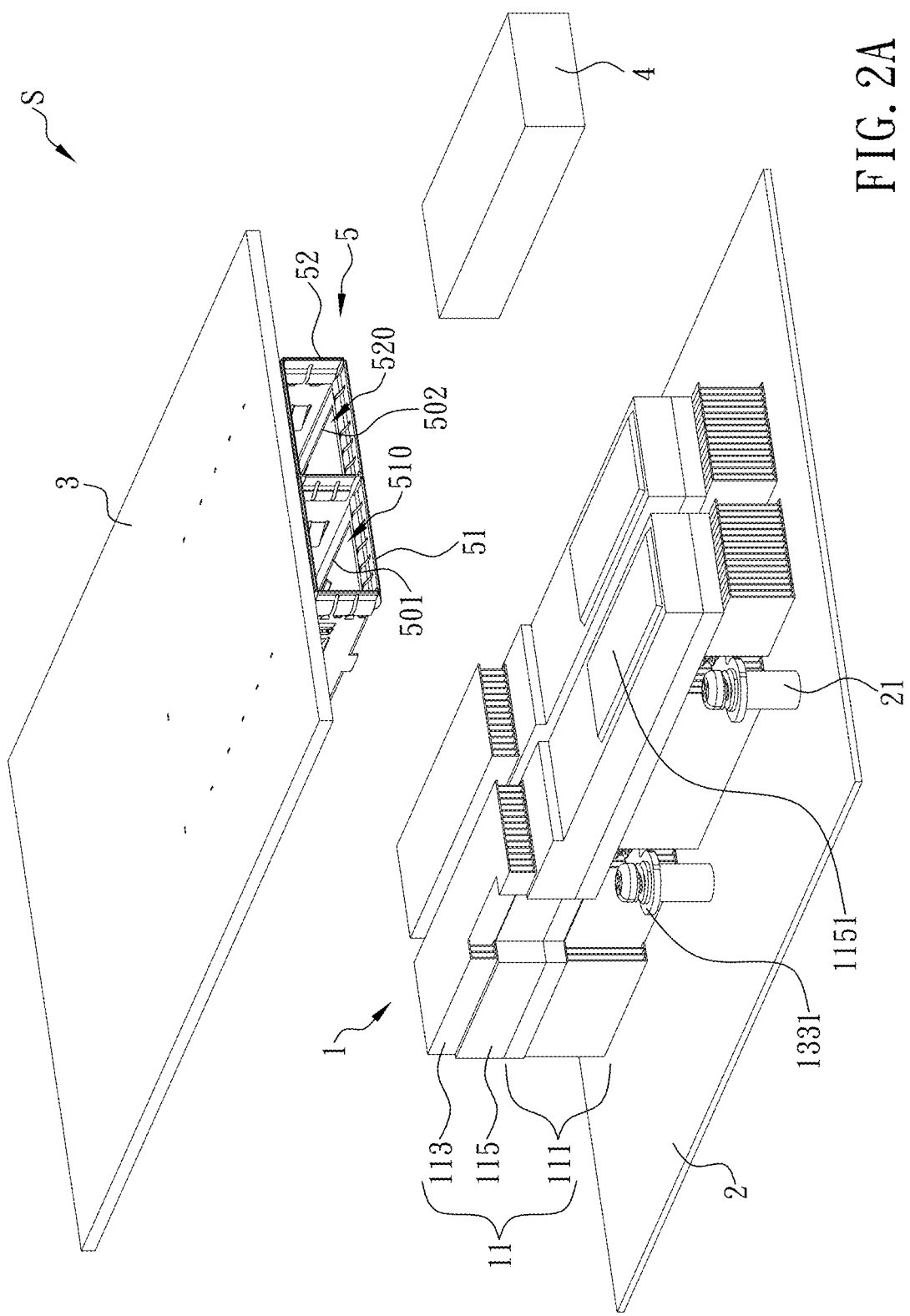
FIG. 2A is a partially exploded view of an optical module according to certain embodiments of the present disclosure.

Certain aspects of the present disclosure are directed to a separated heat dissipating device having a suspension mechanism and an optical module system thereof. Referring to FIGS. 2A-3, in certain embodiments, the optical module system S includes an optical module device 4 (e.g., a small form-factor pluggable (SFP) transceiver, Quad SFP (QSFP) transceiver, C form-factor pluggable (CFP) receiver, fiber optical transceiver (FOT), optical receiver, QSFP-DD transceiver, etc.) and a separated heat dissipating device 1. In certain embodiments, the optical module device 4 can be an optoelectronic component that utilizes electrical energy for optoelectronic signal conversion or optical signal amplification in an optical fiber communication system, and can include components such as one or more optoelectronic elements, one or more functional circuits, one or more optical interfaces, etc. The optical module device 4 can have a signal transmitting end and a signal receiving end, that is, it can convert an electrical signal into an optical signal at the transmitting end, transmit the signal through an optical fiber, and convert the optical signal into an electrical signal at the receiving end. In certain embodiments, the separated heat dissipating device 1 includes two heat dissipating modules 11 and two suspension mechanisms 13. To facilitate description of the relative positions of the various elements, the front side of each element is defined as facing the lower left corner of FIG. 2A, the rear side as facing the upper right corner of FIG. 2A, the left side as facing the upper left corner of FIG. 2A, the right side as facing the lower right corner of FIG. 2A, an upper side (e.g., the top side) as facing the top edge of FIG. 2A, and a lower side (e.g., the bottom side) as facing the bottom edge of FIG. 2A. The configuration of the separated heat dissipating device 1 and the configuration of the assembly of the separated heat dissipating device 1 and the shell 2 and/or the circuit board 3 are not limited to that shown in FIGS. 2A-6, and a manufacturer may adjust the configuration of any element of the separated heat dissipating device 1, the shell 2 and/or the circuit board 3. As long as such a separated heat dissipating device has the basis structure and functions of the separated heat dissipating device 1 disclosed in the present disclosure, it falls within the definition of the separated heat dissipating device 1 according to the present disclosure.

Figure 2B:
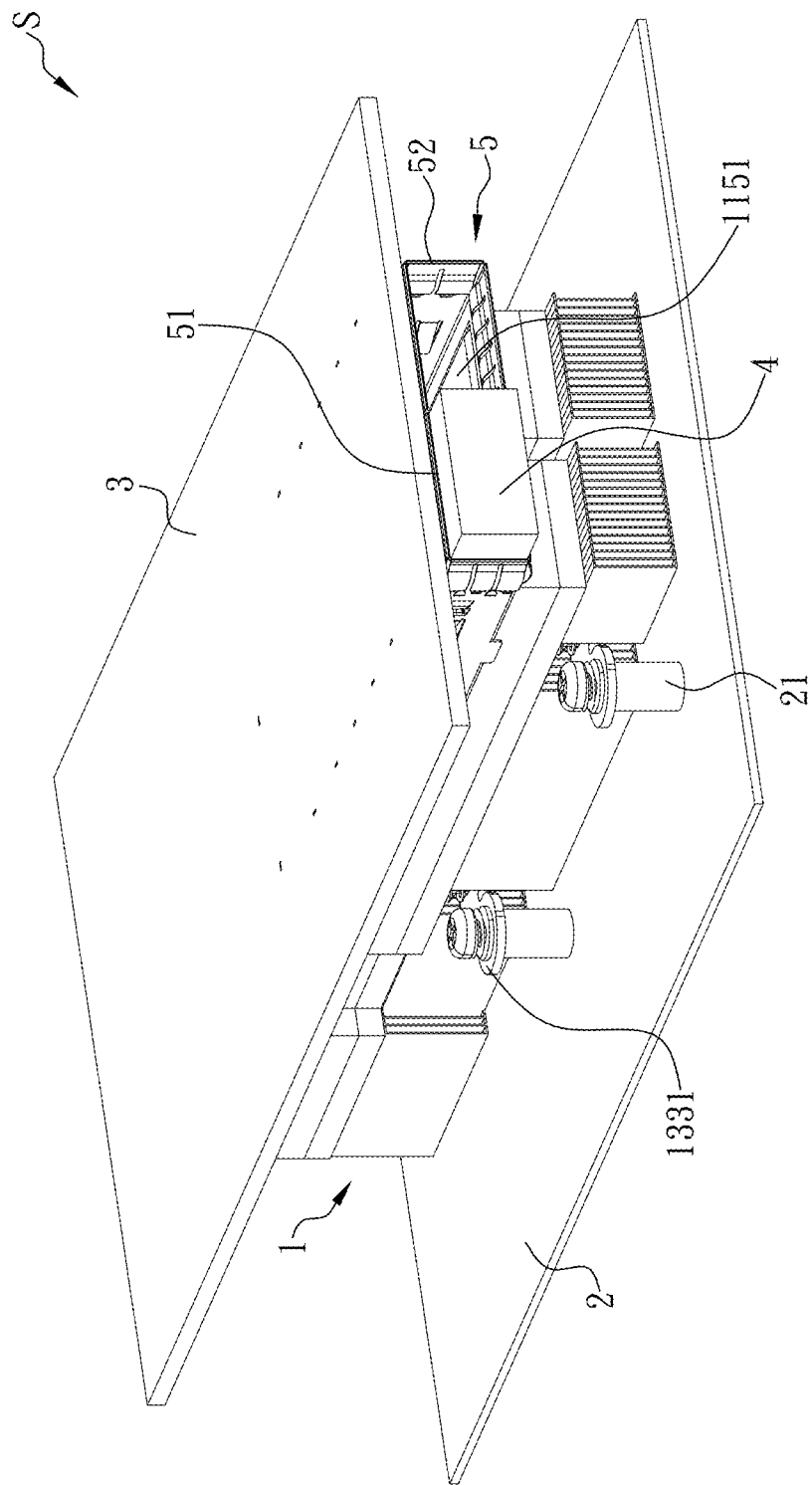
FIG. 2B is a prospect view of an optical module according to certain embodiments of the present disclosure.
Figure 3:
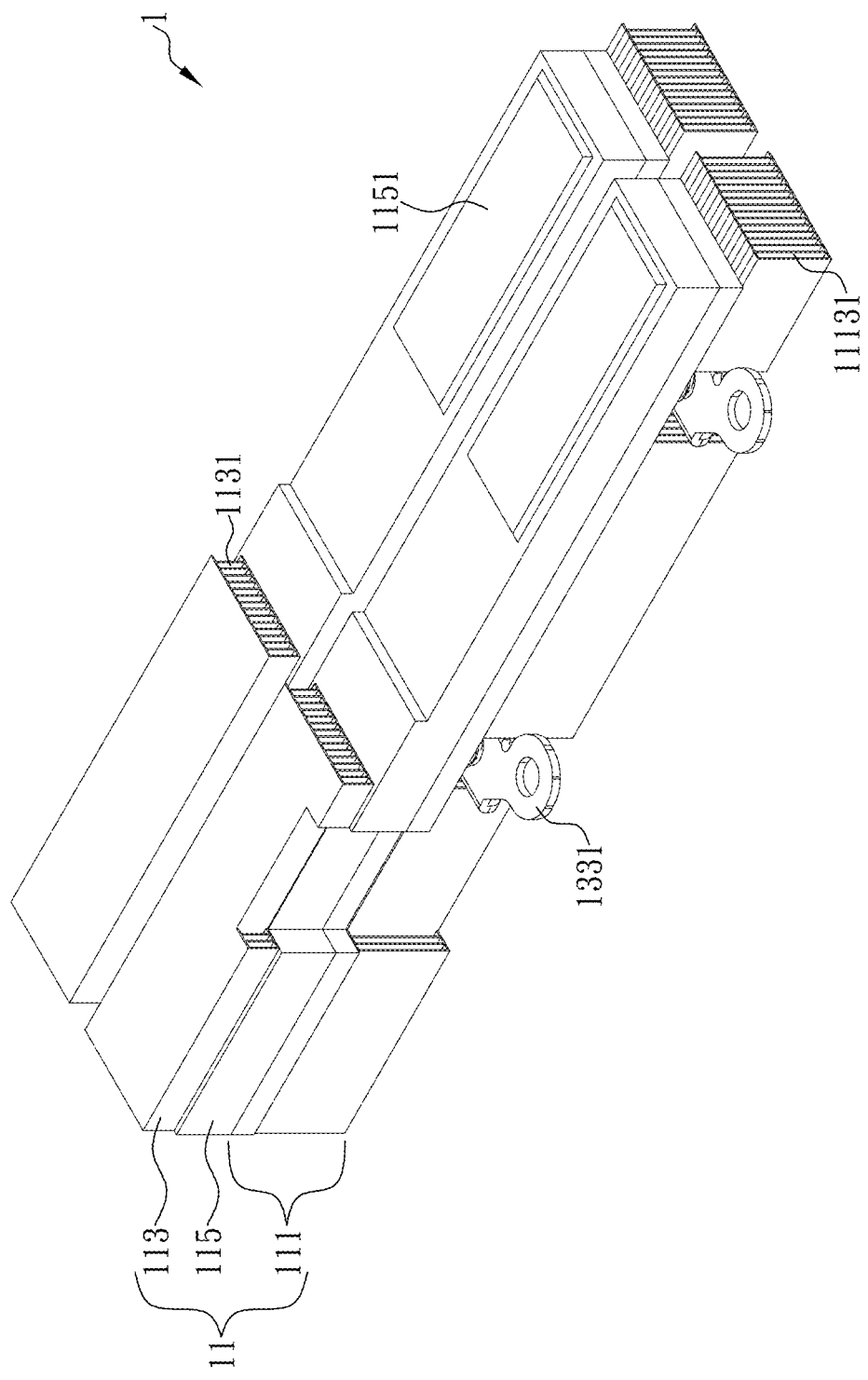
FIG. 3 is a prospect view of a separated heat dissipating device according to certain embodiments of the present disclosure.
Figure 4:
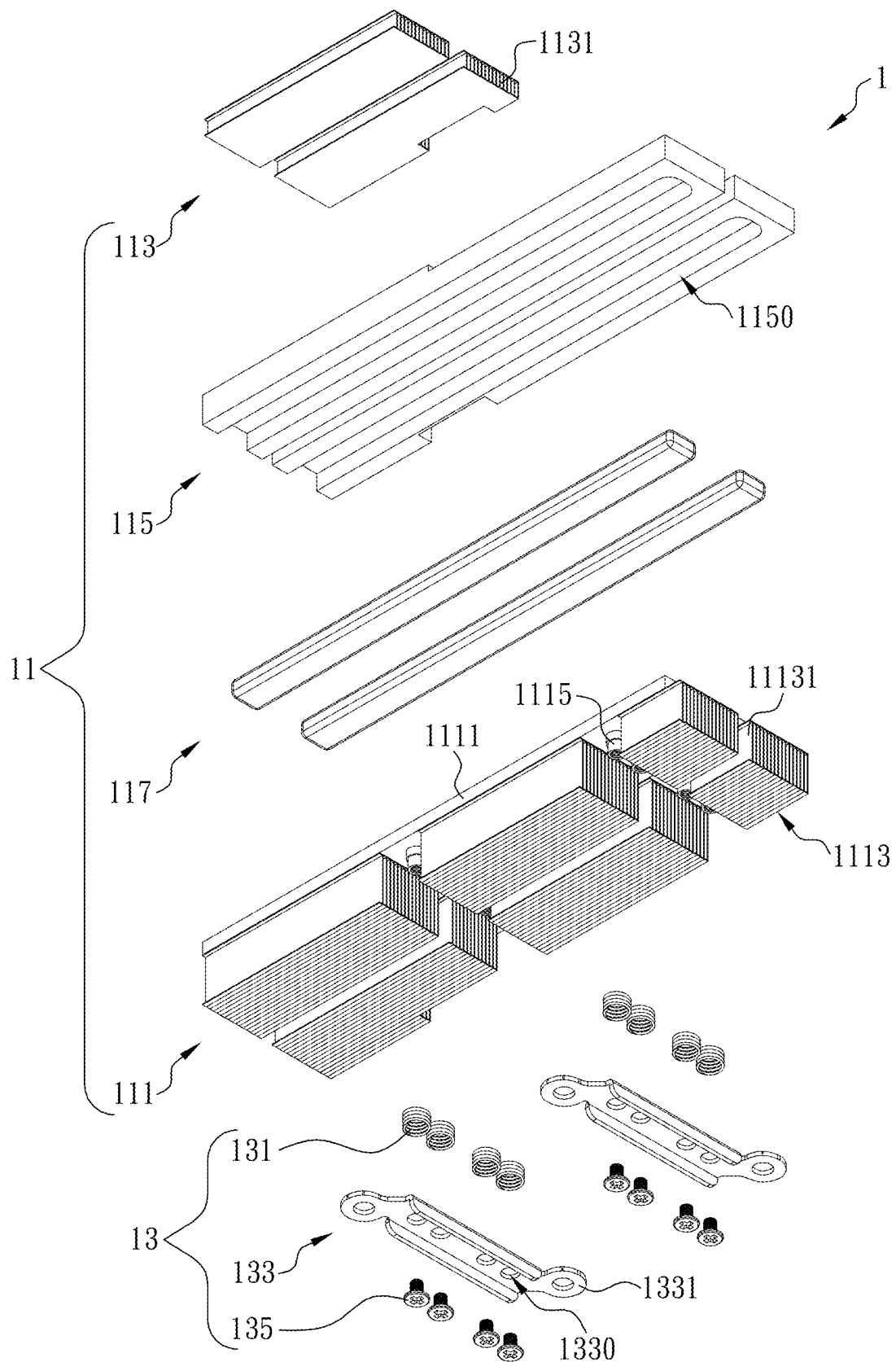
FIG. 4 is an exploded view of a separated heat dissipating device according to certain embodiments of the present disclosure.

Referring to FIGS. 2A and 2B. a connection frame 5 is disposed on a circuit board 3 (e.g., the bottom surface of the circuit board 3 as shown in FIG. 2A). In certain embodiments, the right side of the connection frame 5 has a first insertion and connection port 51 and a second insertion and connection port 52 (e.g., FR4 ports). Inside the first insertion and connection port 51 and the second insertion and connection port 52 are a first insertion and connection space 510 and a second insertion and connection space 520 respectively. The first insertion and connection port 51 is in communication with the first insertion and connection space 510, and the second insertion and connection port 52 is in communication with the second insertion and connection space 520. The bottom surface of the connection frame 5 is further formed with a first opening 501 and a second opening 502. The first opening 501 is in communication with the first insertion and connection space 510, and the second opening 502 is in communication with the second insertion and connection space 520, so that an optical module device 4 can extend into the first insertion and connection space 510 (or the second insertion and connection space 520) through the first insertion and connection port 51 (or the second insertion and connection port 52) such that at least a portion of the surface of the optical module device 4 is exposed through the first opening 501 (or the second opening 502). In certain embodiments, however, the connection frame 5 can be provided with only one insertion and connection port, one insertion and connection space, and one opening to meet practical needs.

A separated heat dissipating device 1 is configured to be, and is shown in FIG. 2A and FIG. 2B as, mounted on a shell 2. A circuit board 3 mounted with the connection frame 5 can be fastened to the separated heat dissipating device 1 and thereby secured in position. After that, the optical module device 4 can be inserted into, for example, the first insertion and connection space 510 through the first insertion and connection port 51 in order to be electrically connected to the circuit board 3 and contact the separated heat dissipating device 1 through the first opening 501 (see FIG. 2B for the assembled configuration) so that the heat generated by the optical module device 4 can be conducted to the separated heat dissipating device 1. It is noted that the method of putting the foregoing elements together is not limited to that described above. For example, it is feasible to begin by inserting the optical module device 4 into the connection frame 5 on the circuit board 3, then move the circuit board 3 (along with the connection frame 5 and the optical module device 4 inserted therein) in a direction toward the separated heat dissipating device 1 (e.g., in the downward direction in FIG. 2A), and then mount the circuit board 3 on the separated heat dissipating device 1. In order for certain structures of the separated heat dissipating device 1 to be easily seen, only one separated heat dissipating device 1 is shown mounted in the configuration shown in FIG. 2A and FIG. 2B. However, the present disclosure is not limited thereto. Also, the foregoing mounting mode anticipates other obvious variations, including those where another optical module device 4 is inserted into the second insertion and connection space 520 through the second insertion and connection port 52 and electrically connected to the circuit board 3.

Referring to FIG. 2A to FIG. 4, in certain embodiments, the top surface of a heat dissipation module 11 of the separated heat dissipating device 1 is configured to lie against the bottom surface of an optical module device 4 through the corresponding first opening 501 or second opening 502, and the bottom surface of the heat dissipation module 11 can be provided with four first mounting members 1115. Each heat dissipation module 11 includes at least one first heat dissipation portion 111, at least one second heat dissipation portion 113, and a base 115. A first heat dissipation portion 111 can include a substrate 1111, three fin units 1113, and the four first mounting members 115. Each fin unit 1113 includes a plurality of fins 11131, each two adjacent ones of three fin units 1113 of each first heat dissipation portion 111 are separated from each other by an interval, and a suspension mechanism 13 and two first mounting members 1115 can be disposed in the interval between each two adjacent fin units 1113. The inner surface of each first mounting member 1115 has a first thread portion 11151, and each first mounting member 1115 has different outer diameters. For example, a first outer diameter of a first mounting member 1115 that is closer to the substrate 1111 than a second outer diameter of the first mounting member 1115 is can be greater than the second outer diameter, and a shoulder 11153 (see FIG. 5A) can be formed at the junction between a first outer wall surface with the larger outer diameter and a second outer wall surface with the smaller outer diameter. A second heat dissipation portion 113 has a plurality of fins 1131. The base 115 can be made of a highly thermally conductive metal (e.g., aluminum), be sandwiched between the corresponding first heat dissipation portion 111 and second heat dissipation portion 113, be formed with a receiving space 1150 and have a protruding portion 1151. A heat-spreading element 117 (e.g., a heat pipe, a vapor chamber, etc.) can be received in the receiving space 1150. The protruding portion 1151 can be provided on a lateral surface of the base 115 that is to lie against an optical module device 4 (in FIG. 2A and FIG. 2B for example, the top surface of the base 115 can lie against the bottom surface of an optical module device 4 and has a corresponding protruding portion 1151). Moreover, a protruding portion 1151 can be exposed through a corresponding first opening 501 or second opening 502 to increase the contact area, and the tightness of contact, between the base 115 and an optical module device 4 and reduce the contact thermal resistance at the same time.

Referring to FIG. 2A to FIG. 4, a suspension mechanism 13 can be mounted on the bottom surface of a heat dissipation module 11, and include four elastic elements 131, a fixing plate 133, and four second mounting members 135. Each elastic element 131 can be sleeved around a corresponding first mounting member 1115 of the corresponding heat dissipation module 11, and be located between the corresponding heat dissipation module 11 and the corresponding fixing plate 133. Each fixing plate 133 can be formed with four through holes 1330 and have two positioning portions 1331, and each through hole 1330 allows passage of a corresponding first mounting member 1115. In certain embodiments, the separated heat dissipating device 1 can be locked to the shell 2 (although the present disclosure is not limited thereto), the shell 2 is provided with a plurality of props 21 at the front and rear sides of the shell 2, and the positioning portions 1331 of the fixing plates 133 correspond in position to the props 21 respectively and are configured to be securely sleeved around the props 21 respectively (although the present disclosure is not limited thereto). The props 21 can be arranged in an offset configuration, and therefore so can the corresponding positioning portions 1331, to shorten the spacing between the separated heat dissipating device 1 and another device (e.g., another separated heat dissipating device). The periphery of each second mounting member 135 has a second thread portion 1351 corresponding to, and threadedly connectable with, the first thread portion 11151 of the corresponding first mounting member 1115. The fixing plate 133 of each suspension mechanism 13 in certain embodiments can span across both heat dissipation modules 11, and the second mounting members 135 corresponding to each heat dissipation module 11 can be inserted into and secured to the first mounting members 1115 of each heat dissipation module 11 respectively through the first thread portion 11151 and the second thread portion 1351. In certain embodiments, each fixing plate 133 can be fixed on the corresponding prop(s) 21 by a tight fit, mechanical engagement, adhesive bonding, soldering, etc. In certain embodiments, each prop 21 can include a plurality of elements (e.g., a threaded fastener, an element with a shoulder, etc.) so that the positioning portion 1331 mounted on each prop 21 is limited in position by the structure of the prop 21 and is prevented from displacement.

Figure 5A:
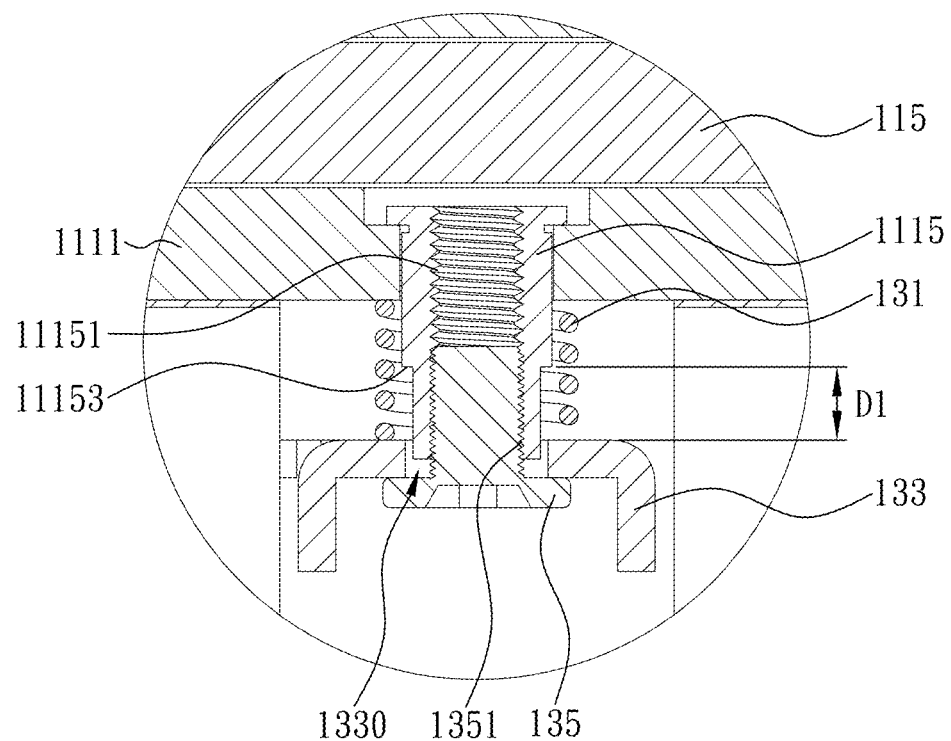
FIG. 5A is a horizontal cross-sectional view of an uncompressed elastic element according to certain embodiments of the present disclosure.
Figure 5B:
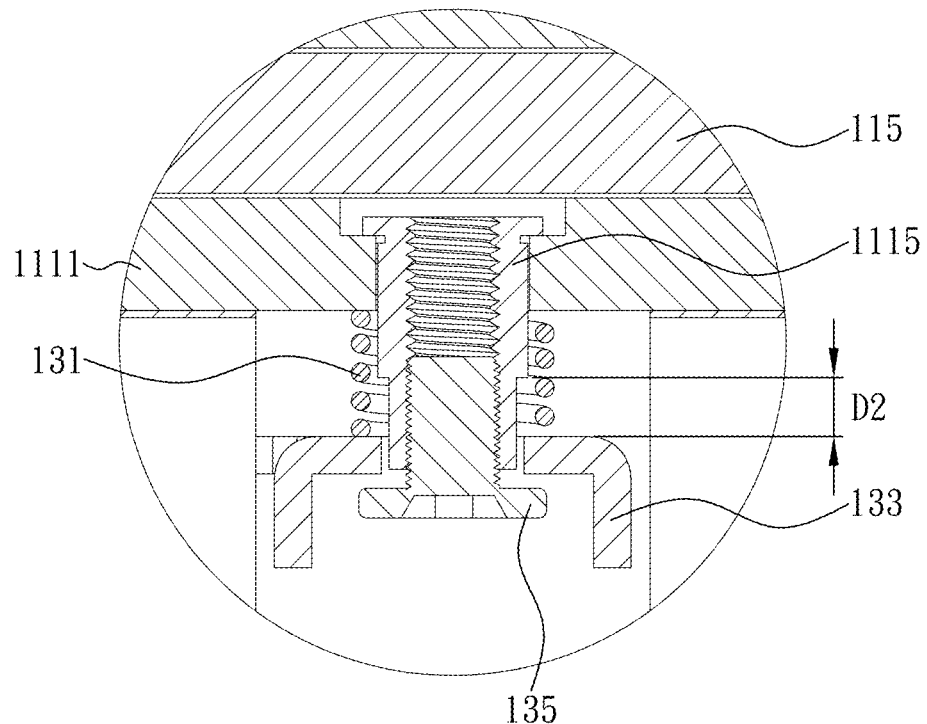
FIG. 5B is a horizontal cross-sectional view of a compressed elastic element according to certain embodiments of the present disclosure.

Referring to FIGS. 5A and 5B, before the separated heat dissipating device 1 and the optical module device 4 are put together, or before the circuit board 3 is mounted with the optical module device 4, the elastic elements 131 are not subjected to the compressive force that could otherwise have been generated by displacement of the heat dissipation modules 11, and a first distance D1 is formed between the shoulder 11153 of each first mounting member 1115 and the top surface of the corresponding fixing plate 133. When the circuit board 3 mounted with the optical module device 4 is moved toward and eventually mounted on the separated heat dissipating device 1, or when the optical module device 4 is inserted into the first insertion and connection space 510 (or the second insertion and connection space 520) and contacts the separated heat dissipating device 1 (or in a situation when the optical module device 4 is pulled out and replaced by another optical module device during use of the optical module system S), the top surface of each heat dissipation module 11 will be subjected to a force applied from above (i.e., the force applied by the optical module device 4). When the first mounting members 1115 and the corresponding second mounting members 135 are threadedly connected together, and the positioning portions 1331 are locked to the shell 2, the heat dissipation modules 11 will have been moved toward the fixing plates 133 (i.e., downward) and compressed the elastic elements 131 such that, with the compressive force applied by the heat dissipation modules 11 to the elastic elements 131 being greater than the elastic force of the elastic elements 131, the elastic elements 131 are elastically deformed, which results in a second distance D2 between the shoulder 11153 and the top surface of the corresponding fixing plate 133, as shown in FIG. 5B. The second distance D2 is smaller than the first distance D1. When the optical module device 4 is removed, or when the optical module device 4 is removed along with the circuit board 3, the elastic elements 131 will release the elastic force stored therein and return to the uncompressed state. Also, the deformation of elastic elements 131 can vary in accordance with different degrees of compressive force applied by different heat dissipation modules 11. Accordingly, the separated heat dissipating device 1 according to the present disclosure effectively enjoys enhanced stability of force application on the surface in contact with the optical module device 4, and hence also enhanced equilibrium of the forces acting on the surface. After the heat dissipation modules 11 are displaced by the force applied thereto, the shoulder 11153 will generally get closer to the top surface of the corresponding fixing plate 133. Taking into consideration a part of an elastic element 131 being located between the corresponding shoulder 11153 and the corresponding fixing plate 133, and the space occupied by an elastic element 131, in certain embodiments, the second distance D2 between a shoulder 11153 and the corresponding fixing plate 133 is slightly greater than or equal to 0 or substantially equal to 0.

Figure 6:
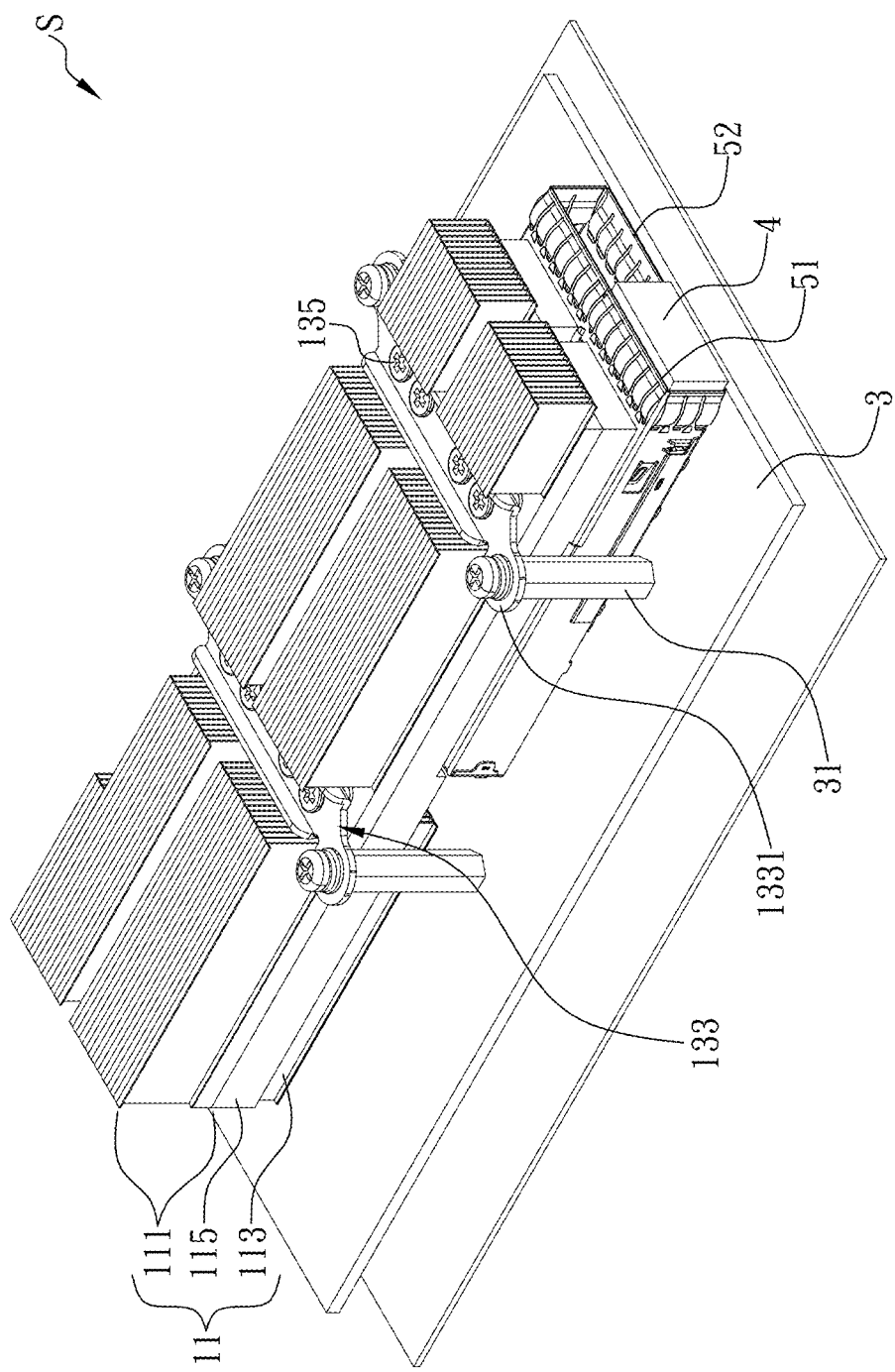
FIG. 6 is a prospect view of an optical module system according to certain embodiments of the present disclosure.

Referring to FIG. 6, in certain embodiments, the separated heat dissipating device 1 is configured to be locked to a circuit board 3 that is provided with a plurality of props 31, and the fixing plates 133 are configured to be fixed on the props 31. When the separated heat dissipating device 1 is moved toward the optical module device 4 on the circuit board 3 and eventually fixed on the circuit board 3, or when the optical module device 4 is inserted into an insertion and connection space of the circuit board 3 and contacts the separated heat dissipating device 1, the bottom surface of each heat dissipation module 11 will be subjected to a force applied from below (i.e., the force applied by the optical module device 4). Once each first mounting member 1115 and the corresponding second mounting member 135 are threadedly connected together (similar to that shown in FIG. 4 to FIG. 5B), and the positioning portions 1331 are fixed on the circuit board 3, the heat dissipation modules 11 will have been moved toward the fixing plates 133 (i.e., upward) and compressed the elastic elements 131 (similar to that shown in FIG. 4 to FIG. 5B) such that, with the compressive force applied by the heat dissipation modules 11 to the elastic elements 131 being greater than the elastic force of the elastic elements 131, the elastic elements 131 are elastically deformed.

In certain embodiments, an optical module system S has two optical module devices 4, two heat dissipation modules 11 corresponding respectively to the two optical module devices 4, and two suspension mechanisms 13. However, the present disclosure is not limited thereto. In certain embodiments, there can be only one heat dissipation module 11, and the heat dissipation module 11 can work with one or a plurality of suspension mechanisms 13. As the number of suspension mechanisms 13 increases, so will the equilibrium of the forces acting on the various surface areas of each heat dissipation module 11 increase. Accordingly, a manufacturer can adjust the respective numbers of the optical module device 4, the heat dissipation module 11 and suspension mechanism 13 according to practical product requirements, and as long as a separated heat dissipating device and/or an optical module system can achieve stable force application and equilibrium on a thermal conduction contact surface, it is the separated heat dissipating device 1 and/or the optical module system S defined in the present disclosure.

Figure 7:
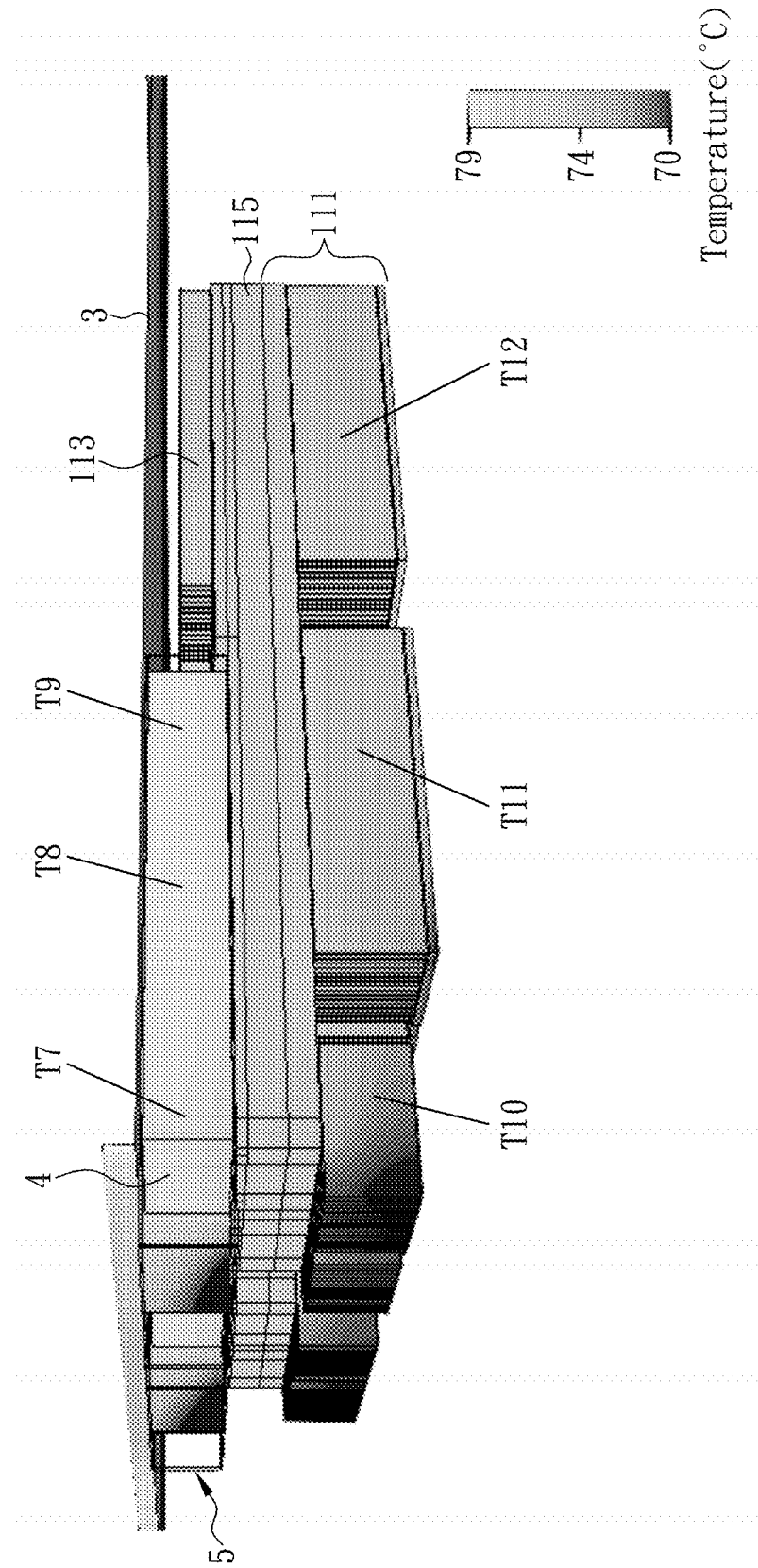
FIG. 7 is a temperature distribution diagram of an optical module system according to certain embodiments of the present disclosure.

In summary, the separated heat dissipating device 1 according to the present disclosure can spread heat much more evenly. As shown in FIG. 7, the seventh temperature T7 is 76.8° C., the eighth temperature T8 is 77.6° C., the ninth temperature T9 is 77.8° C., the tenth temperature T10 is 71.6° C., the eleventh temperature T11 is 74.2° C., and the twelfth temperature T12 is 74.5° C. By increasing the degree of tight contact between the thermal conduction surfaces, force application on those surfaces is more stable and better force equilibrium can be achieved. Moreover, as the heat-spreading elements 117 solve the problem that the heat dissipation ability tends to decrease with an increase in the distance from the heat source, the heat-spreading ability of the fins 1131 and 11131 is strengthened (e.g., the greatest temperature difference across the first heat dissipation portion 111 is reduced to 3° C.), which further enhances the heat dissipation ability of the separated heat dissipating device 1, allowing the heat of the optical module device 4 to be spread evenly and dissipated quickly, and the system's operating temperature to be increased by 5 to 10° C. during high-speed transmission. The device and system according to the present disclosure also allow modules that can be shared among different products to be developed in a systematic manner according to the requirements of a chain of product specifications, and accordingly have effectively improved on the conventional heat sinks to satisfy the use requirements of the industry.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A separated heat dissipating device, comprising:
    at least one heat dissipating module, having a first lateral surface configured to abut against a surface of an electronic device and a second lateral surface disposed with at least one first mounting member; and
    at least one suspension mechanism, configured to be mounted on the second lateral surface of the at least one heat dissipating module, and comprising:
        at least one elastic element configured to be sleeved around the at least one first mounting member of the at least one heat dissipating module;
        a fixing plate formed with at least one through hole configured to allow passage of the at least one first mounting member and allow the at least one elastic element to be located between the at least one heat dissipating module and the fixing plate; and
        at least one second mounting member configured to be assembled with the at least one first mounting member,
    wherein the at least one heat dissipating module moves towards the fixing plate and compresses the at least one elastic element when a surface of the at least one heat dissipating module is applied with a force.

2. The separated heat dissipating device according to claim 1, wherein the at least one heat dissipating module comprises two heat dissipating modules, the at least one first mounting member comprises a plurality of first mounting members, and the at least one second mounting member comprises a plurality of second mounting members, wherein the fixing plate of the suspension mechanism is configured to span across the two heat dissipating modules, and be fixed to the first mounting members of the two heat dissipating modules through the second mounting members of the suspension mechanism.

3. The separated heat dissipating device according to claim 2, wherein each of the two heat dissipating modules comprises a first heat dissipating portion, a second heat dissipating portion and a base, the first heat dissipating portion comprises a plurality of first fins, the second heat dissipating portion comprises a plurality of second fins, and the base is made of a metal material and configured to be sandwiched between the first heat dissipating portion and the second heat dissipating portion.

4. The separated heat dissipating device according to claim 3, wherein the first fins are arranged in fin units, each two adjacent ones of the fin units are separated from each other by an interval, and the interval is disposed with the suspension mechanism.

5. The separated heat dissipating device according to claim 3, wherein the base is formed with a receiving space for receiving at least one of at least one heat pipe or at least one vapor chamber.

6. The separated heat dissipating device according to claim 3, wherein a lateral surface of the base configured to lie against the electronic device has a protruding portion to increase a contact area between the base and the electronic device.

7. The separated heat dissipating device according to claim 2, wherein the separated heat dissipating device is configured to be locked to a shell having at least one prop, and the fixing plate is configured to be fixed to the prop.

8. The separated heat dissipating device according to claim 2, wherein the separated heat dissipating device is configured to be locked to a circuit board having at least one prop, and the fixing plate is configured to be fixed to the prop.

9. The separated heat dissipating device according to claim 2, wherein an inner surface of each of the first mounting members has a first thread portion, an outer surface of each of the second mounting members has a second thread portion corresponding to and threadedly connectable with a respective one of the first thread portion, and each of the second mounting members is configured to be inserted into and assembled with a corresponding one of the first mounting members through the first thread portion and the second thread portion.

10. The separated heat dissipating device according to claim 1, wherein the at least one heat dissipating module comprises a first heat dissipating portion, a second heat dissipating portion and a base, the first heat dissipating portion comprises a plurality of first fins, the second heat dissipating portion comprises a plurality of second fins, and the base is made of a metal material and configured to be sandwiched between the first heat dissipating portion and the second heat dissipating portion.

11. The separated heat dissipating device according to claim 10, wherein the first fins are arranged in fin units, each two adjacent ones of the fin units are separated from each other by an interval, and the interval is disposed with the suspension mechanism.

12. The separated heat dissipating device according to claim 10, wherein the base is formed with a receiving space for receiving at least one of at least one heat pipe or at least one vapor chamber.

13. The separated heat dissipating device according to claim 10, wherein a lateral surface of the base configured to lie against the electronic device has a protruding portion to increase a contact area between the base and the electronic device.

14. The separated heat dissipating device according to claim 1, wherein the separated heat dissipating device is configured to be locked to a shell having at least one prop, and the fixing plate is configured to be fixed to the prop.

15. The separated heat dissipating device according to claim 1, wherein the separated heat dissipating device is configured to be locked to a circuit board having at least one prop, and the fixing plate is configured to be fixed to the prop.

16. The separated heat dissipating device according to claim 1, wherein an inner surface of the at least one first mounting member has a first thread portion, an outer surface of the at least one second mounting member has a second thread portion corresponding to, and threadedly connectable with, the first thread portion, and the at least one second mounting member is configured to be inserted into and assembled with the at least one first mounting member through the first thread portion and the second thread portion.

17. An optical module system, comprising:
an optical module device configured to be mounted on a circuit board; and
a separated heat dissipating device configured to be assembled with the optical module device and comprising:
  at least one heat dissipating module, having a first lateral surface configured to abut against a surface of the optical module device and a second lateral surface disposed with at least one first mounting member; and
  at least one suspension mechanism, configured to be mounted on the second lateral surface of the at least one heat dissipating module, and comprising:
    at least one elastic element configured to be sleeved around the at least one first mounting member of the at least one heat dissipating module;
    a fixing plate formed with at least one through hole configured to allow passage of the at least one first mounting member and allow the at least one elastic element to be located between the at least one heat dissipating module and the fixing plate; and
    at least one second mounting member configured to be assembled with the at least one first mounting member,
  wherein the at least one heat dissipating module moves towards the fixing plate and compresses the at least one elastic element when a surface of the heat dissipating module is applied with a force.

* * * * *